United States Patent
Inoue (10) Patent No.: US 9,160,361 B2
(45) Date of Patent: Oct. 13, 2015

(54) COMPRESSED DATA TRANSCEIVER APPARATUS, DATA COMPRESSOR DEVICE, COMPRESSED DATA RECEIVER DEVICE AND DATA COMPRESSION METHOD

(75) Inventor: Hiroaki Inoue, Tokyo (JP)

(73) Assignee: NEC CORPORATION, Tokyo (JP)

( * ) Notice: Subject to any disclaimer, the term of this patent is extended or adjusted under 35 U.S.C. 154(b) by 868 days.

(21) Appl. No.: 13/379,271

(22) PCT Filed: Jun. 1, 2010

(86) PCT No.: PCT/JP2010/059581
§ 371 (c)(1),
(2), (4) Date: Dec. 19, 2011

(87) PCT Pub. No.: WO2011/001790
PCT Pub. Date: Jan. 6, 2011

(65) Prior Publication Data
US 2012/0099626 A1   Apr. 26, 2012

(30) Foreign Application Priority Data
Jun. 30, 2009   (JP) .................... 2009-154931

(51) Int. Cl.
*H03M 7/30* (2006.01)

(52) U.S. Cl.
CPC .............. *H03M 7/30* (2013.01); *H03M 7/3086* (2013.01); *H03M 7/6023* (2013.01)

(58) Field of Classification Search
CPC ..... H04N 19/91; H04N 19/13; H04N 19/146; H03M 7/40; H03M 7/30
USPC ................ 375/240, 240.23, 240.25; 341/67; 714/779
See application file for complete search history.

(56) References Cited

U.S. PATENT DOCUMENTS

2003/0026491 A1 * 2/2003 Hahm et al. .................. 382/245
2004/0264489 A1 * 12/2004 Klemets et al. ............... 370/428

FOREIGN PATENT DOCUMENTS

| JP | 6-14314 A | 1/1994 |
| JP | 11-154951 A | 6/1999 |
| JP | 2000299664 A | 10/2000 |
| JP | 2000341535 A | 12/2000 |
| JP | 2001148858 A | 5/2001 |
| JP | 2008152409 A | 7/2008 |

OTHER PUBLICATIONS

International Search Report for PCT/JP2010/059581 mailed Aug. 17, 2010.

* cited by examiner

*Primary Examiner* — Curtis Odom
(74) *Attorney, Agent, or Firm* — Sughrue Mion, PLLC (57) ABSTRACT

To provide a data compression method that can achieve a high data compression ratio and does not require a buffer circuit or only requires a buffer circuit having a small storage capacity at a receiving side. A data compressor device has an adjustment and compression tool operable to switch a plurality of code words having different code lengths and compress input data at a rate that does not exceed a predetermined receiving speed.

5 Claims, 8 Drawing Sheets

| 00 | 4-BIT DATA HAVING NO SIGN EXTENSION |
|---|---|
| 01 | 8-BIT DATA HAVING NO SIGN EXTENSION |
| 10 | 16-BIT DATA HAVING NO SIGN EXTENSION |
| 11 | 32-BIT DATA HAVING NO SIGN EXTENSION |

FIG. 10A

| 000 | ALL ZEROS |
|---|---|
| 001 | 4-BIT DATA HAVING NO SIGN EXTENSION |
| 010 | $0x0\alpha0\beta$ |
| 011 | $0x\alpha0\beta0$ |
| 100 | 8-BIT DATA HAVING NO SIGN EXTENSION |
| 101 | 8-BIT ZERO-PADDING |
| 110 | SAME VALUE AT UPPER ORDER BYTE AND LOWER ORDER BYTE |
| 111 | 16-BIT DATA HAVING NO SIGN EXTENSION |

COMPRESSED DATA TRANSCEIVER APPARATUS, DATA COMPRESSOR DEVICE, COMPRESSED DATA RECEIVER DEVICE AND DATA COMPRESSION METHOD

TECHNICAL FIELD

The present invention relates to a compressed data transceiver apparatus, a data compressor device, a compressed data receiver device, and a data compression method. More specifically, the present invention relates to a compressed data transceiver apparatus, a data compressor device, a compressed data transceiver system, and a data compression method that change a compression ratio in a suitable manner.

BACKGROUND ART

Reconfigurable devices represented by an FPGA (Field Programmable Gate Array) require a very long period of time to read configuration information. As a result, for example, if configuration information is updated many times in order to conduct a test of a reconfigurable device, then the time of reading the configuration information becomes predominant in the test time. Therefore, in order to reduce the time of reading the configuration information, it has been desired to supply compressed data of the configuration information to a reconfigurable device and to expand the compressed data within the reconfigurable device for thereby obtaining the configuration information.

Meanwhile, technology of compressing data for transmission has heretofore been known in the field of data communication (see, e.g., Patent Literature 1).

Furthermore, there has also been known a technique of converting a compression level of data into a level that can be expanded at a receiving side (see, e.g., Patent Literature 2).

Moreover, there has heretofore been known technology of performing a compression depending upon the type of the data (see, e.g., Patent Literature 3).

Figure 14:
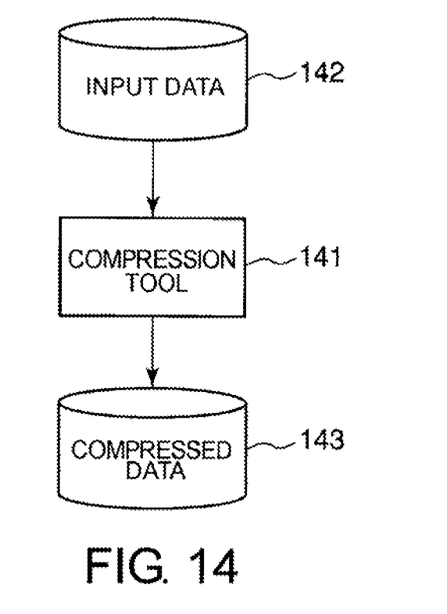
FIG. 14 is a block diagram showing a schematic configuration of a related data compressor device.

FIG. 14 is a diagram schematically showing a compression process of data at a transmitting side. A compression tool 141 is operable to compress data (input data) 142 to be transmitted and outputs them as compressed data 143.

Figure 15:
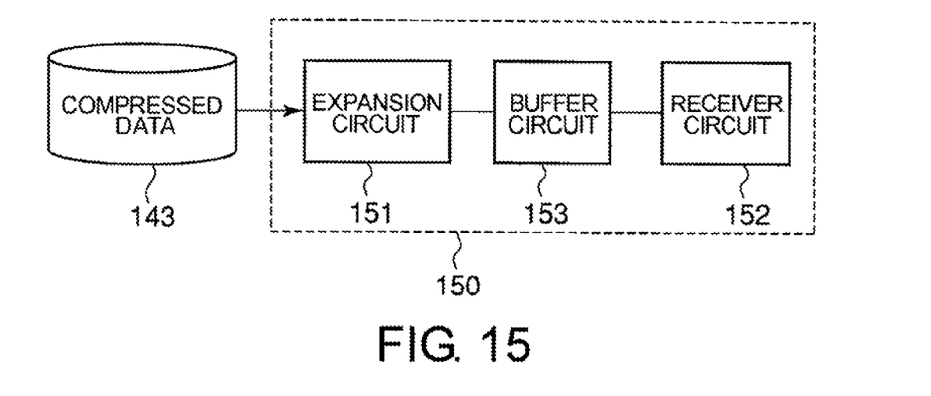
FIG. 15 is a block diagram showing a schematic configuration of a related compressed data receiver device.

FIG. 15 is a diagram schematically showing a related buffer type receiver 150. The buffer type receiver 150 has an expansion circuit 151 and a receiver circuit 152. Furthermore, the buffer type receiver 150 also has a buffer circuit 153 between the expansion circuit 151 and the receiver circuit 152. The compressed data 143 transmitted from the transmitting side are supplied to the expansion circuit 151 and expanded therein. The expanded data are temporarily stored in the buffer circuit 153 and then read by the receiver circuit 152.

Figure 16:
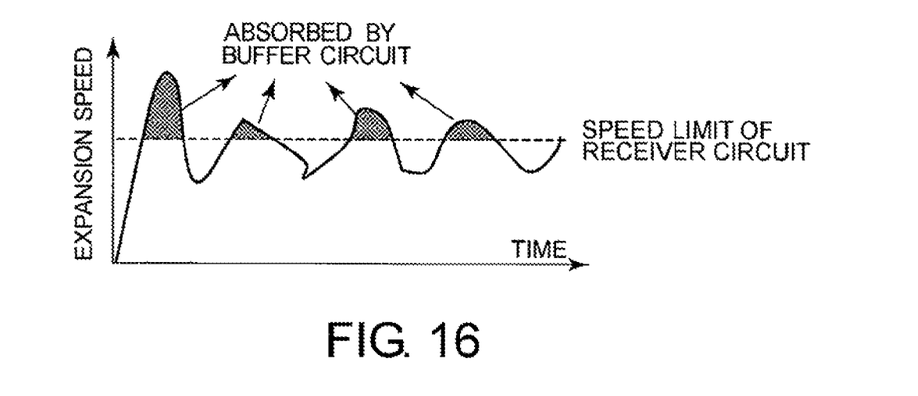
FIG. 16 is a graph showing a time-varying expansion speed of the compressed data receiver device shown in FIG. 15.

FIG. 16 is a graph showing a time-varying expansion speed (output data rate) of the expansion circuit 151. The expansion speed of the expansion circuit 151 is not necessarily constant and varies with passage of time. When the expansion speed of the expansion circuit 151 exceeds a receiving speed (the speed limit or the maximum receiving speed) of the receiver circuit 152, the buffer circuit 153 temporarily stores data that have not been received by the receiver circuit 152 to prevent an overflow of data.

Figure 17:
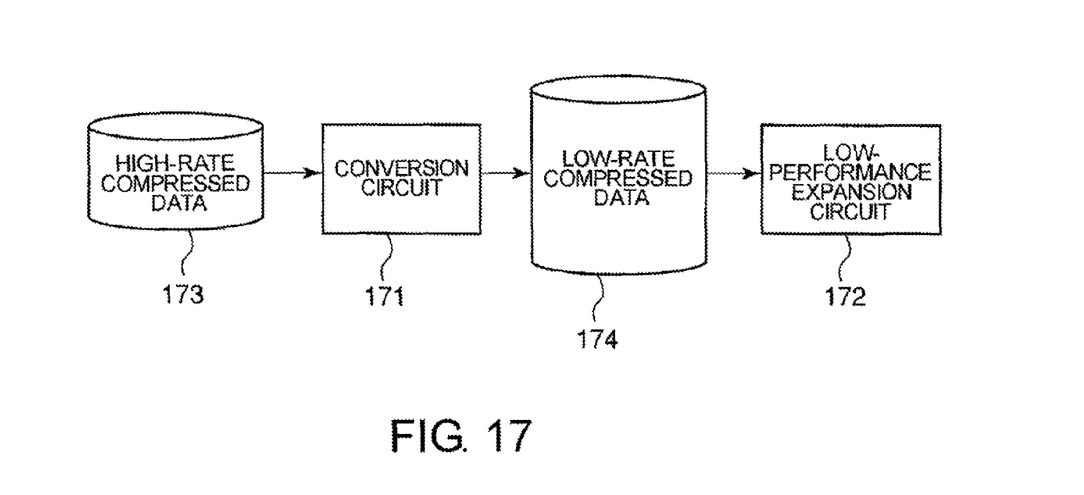
FIG. 17 is a block diagram showing a schematic configuration of a related compressed data conversion apparatus.
Figure 18:
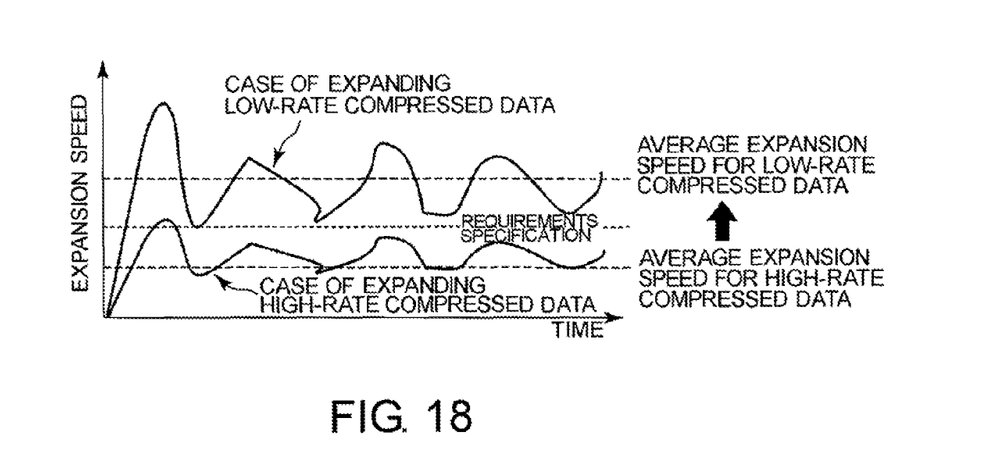
FIG. 18 is a graph showing a time-varying expansion speed of a low-performance expansion circuit used in the compressed data conversion apparatus of FIG. 17.

FIG. 17 is a diagram schematically showing a related compressed data conversion device. A conversion circuit 171 temporarily expands high-rate compressed data 173 and converts the expanded data into low-rate compressed data 174 so that an expansion process can be performed in a low-performance expansion circuit 172. With this configuration, an average expansion speed of the low-performance expansion circuit 172 can be improved as shown in FIG. 18.

Patent Literature 1: JP-A 11-154951
Patent Literature 2: JP-A 2000-299664
Patent Literature 3: JP-A 2001-148858

DISCLOSURE OF THE INVENTION

Problem(s) to be Solved by the Invention

When configuration information is supplied as compressed data to a reconfigurable device, it should be assumed that a flow control such as a request from the reconfigurable device to the transmitting side to stop the transmission of the compressed data cannot be conducted. Therefore, if there is a difference between an expansion speed of an expansion circuit for expanding compressed data and a receiving speed of a receiver circuit for receiving the expanded data, then a buffer circuit for absorbing the difference is essential to the compressed data receiver device.

The buffer circuit provided between the expansion circuit and the receiver circuit needs to have a storage capacity large enough to prevent an overflow of data. However, it is difficult to properly estimate a storage capacity required for the buffer circuit. Therefore, a buffer circuit having a storage capacity larger than is necessary is used in the related compressed data receiver device, thereby causing an increase of the manufacturing cost of the compressed data receiver device.

The technology disclosed in Patent Literature 2 includes changing a compression level so that an expansion can be performed at a receiving side. However, since the compression ratio of the entire compressed data is changed in this technology, the compression ratio of the entire compressed data is lowered if the device configuration is simplified on the receiving side. Accordingly, the technology disclosed in Patent Literature 2 is not suitable for use of providing compressed data having a higher compression ratio to a reconfigurable device.

Furthermore, the technology disclosed in Patent Literature 3 includes suppressing an underflow and an overflow in an image information conversion apparatus (compression process). In other words, this technology is to keep a bit rate of data compressed constant at a transmitting side. According to Patent Literature 3, simplification of the device configuration on a receiving side causes a lowered compression ratio of the entire compressed data as with Patent Literature 2.

The present invention provides a data compression method, a data compressor device, a compressed data receiver device, and a compressed data transceiver apparatus that can solve one or some of the above problems.

Means to Solve the Problem

According to a first aspect of the present invention, a compressed data transceiver apparatus comprises a transmitter device operable to transmit compressed data and a receiver device operable to recover and receive the compressed data, the transmitter device including compression means for generating the compressed data while assigning one of a plurality of code words having different code lengths that are prepared for at least one data unit adaptably at a rate that does not exceed a predetermined receiving speed.

According to a second aspect of the present invention, a data compression method of compressing input data to generate compressed data is characterized by generating the compressed data while adaptably assigning one of a plurality of code words having different code lengths that are prepared for at least one data unit and adjusting a compression ratio of the compressed data with a unit of the code words.

According to a third aspect of the present invention, there can be provided a data compressor device including compression means for generating compressed data while assigning one of a plurality of code words having different code lengths that are prepared for at least one data unit adaptably at a rate that does not exceed a predetermined receiving speed of a receiver device.

According to another aspect of the present invention, a compressed data receiver device can be provided. The compressed data receiver device comprises an expansion circuit operable to expand compressed data and a receiver circuit operable to receive expanded data that have been expanded by the expansion circuit. The expansion circuit includes expansion means for expanding compressed data generated by adaptably assigning one of a plurality of code words having different code lengths that are prepared for at least one data unit. The expansion circuit and the receiver circuit are connected to each other without any buffer circuit or with a buffer circuit having a small capacity.

MODE(S) FOR CARRYING OUT THE INVENTION

Exemplary embodiments of the present invention will be described below in detail with reference to the drawings.

According to an exemplary embodiment, a plurality of patterns of code words are switched for compressing input data at a rate that does not exceed a predetermined receiving speed. Therefore, the expansion speed of a receiving side can be controlled in a state in which the compression ratio is hardly changed. Performing a compression control such that the expansion speed does not exceed the receiving speed can eliminate a buffer circuit between an expansion circuit and a receiver circuit or can remarkably reduce the storage capacity of a buffer circuit. Thus, the manufacturing cost of a compressed data receiver device can be reduced.

Figure 1:
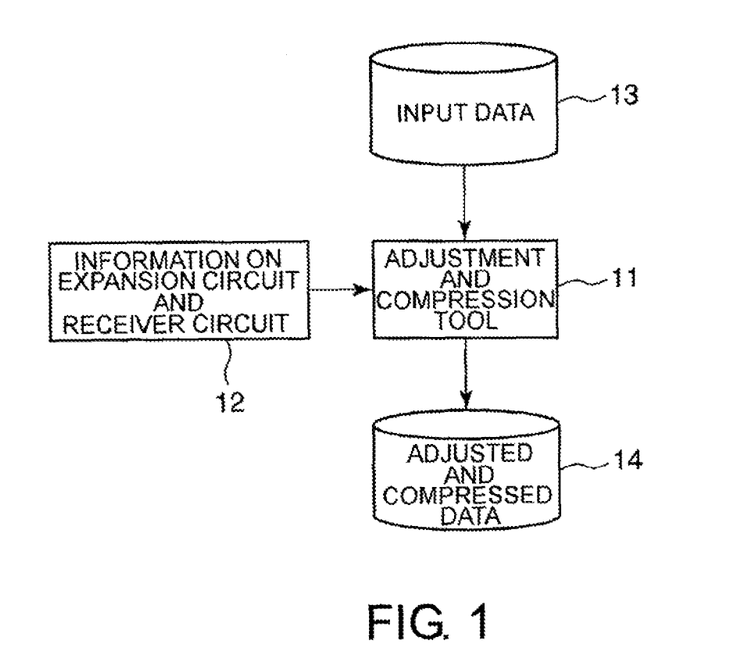
FIG. 1 is a block diagram showing a schematic configuration of a data compressor device used in a compressed data transceiver apparatus according to a first embodiment of the present invention.

FIG. 1 shows a schematic configuration of a data compressor device used in a compressed data transceiver apparatus according to a first exemplary embodiment of the present invention. This data compressor device has an adjustment and compression tool 11 and an information storage unit 12.

The adjustment and compression tool 11 is operable to compress input data 13 and output them as adjusted and compressed data 14. Furthermore, the information storage unit 12 stores therein information used by the adjustment and compression tool 11, i.e., information on the expansion speed of an expansion circuit and the receiving speed of a receiver circuit at a receiving side.

Figure 2:
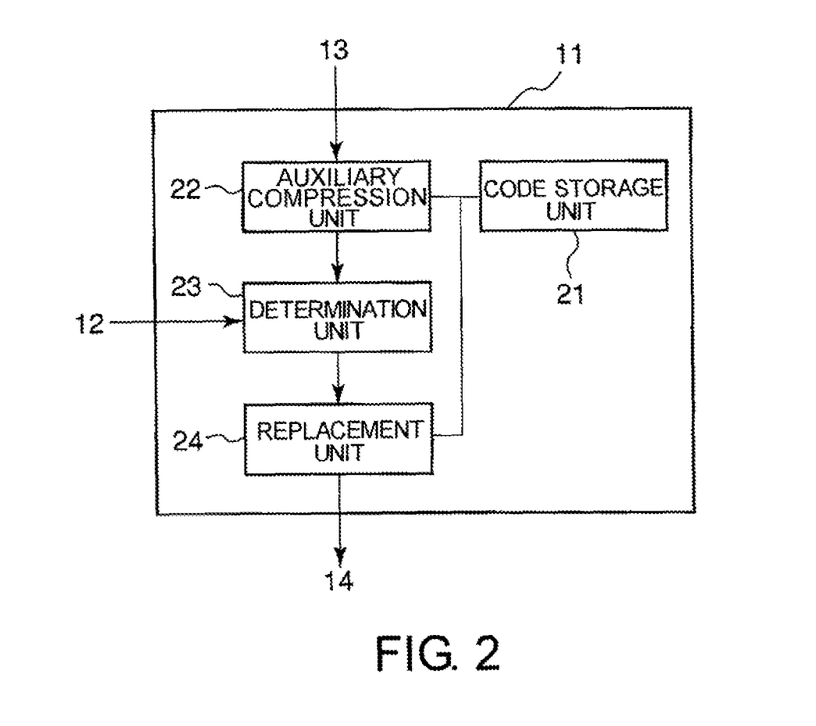
FIG. 2 is a block diagram showing a schematic configuration of an adjustment and compression tool included in the data compressor device of FIG. 1.

FIG. 2 shows an example of a schematic configuration of the adjustment and compression tool 11. In FIG. 2, the adjustment and compression tool 11 has a code storage unit 21, an auxiliary compression unit 22, a determination unit 23, and a replacement unit 24.

The code storage unit 21 serves as code storage means for storing a plurality of code words. Specifically, the code storage unit 21 stores a plurality of code words having different code lengths with regard to one data unit. It is not necessary to assign a plurality of code words to each of all data units. A plurality of code words having different code lengths may be assigned to at least one data unit. Furthermore, a code rule may be predetermined instead of assigning code words to a data unit. With use of a predetermined code rule, it is possible to obtain the same effects as a plurality of types of codes have been prepared. In any case, code words are outputted from the code storage unit 21.

Usually, two types of code words are prepared. One of the two types of code words has a code length longer (or shorter) than the code length of the other type of code words.

The auxiliary compression unit 22 serves as auxiliary compression means for compressing the input data 13 with use of one of code words stored in the code storage unit 21 so as to generate auxiliary compressed data. The code word used in the auxiliary compression unit 22 is a code word that makes the code length of the resultant auxiliary compressed data the shortest.

The determination unit 23 serves as determination means for determining whether or not the expansion speed (data rate) exceeds the receiving speed (predetermined value) if the auxiliary compressed data from the auxiliary compression unit 22 are expanded at the receiving side. Information on the expansion speed and the receiving speed is read from the information storage unit 12. For example, the information on the expansion speed and the receiving speed includes information on how many symbols are expanded for one cycle by the expansion circuit, i.e., how many code words are subjected to an expansion process for one cycle, and information on how many bytes of data can be received for one cycle by the receiver circuit. The determination unit 23 emulates an operation of the expansion circuit with use of that information and determines whether or not the expansion speed of the expansion circuit exceeds the receiving speed of the receiver circuit.

The replacement unit 24 serves as replacement means for replacing a code word for which the determination unit 23 has determined that the expansion speed exceeds the receiving speed with another code word. The expansion speed is suppressed (adjusted) to be equal to or lower than the receiving speed by replacing a code word that would cause the expansion speed to exceed the receiving speed with a code word having a longer code length. The code length of the entire compressed data (i.e., the compression ratio) hardly changes because only unit of code words is replaced with a code word having a different code length.

As described above, the auxiliary compression unit 22, the determination unit 23, and the replacement unit 24 serve as (data) compression means. The auxiliary compression unit 22, the determination unit 23, and the replacement unit 24 compress the input data 13 while they adjust a compression ratio with a unit of the code words such that compressed data have the shortest code length and that the expansion speed of expanding the compressed data is equal to or lower than the receiving speed.

Generally, a code word includes an indicator code part and a digit part following the indicator code part. In a special case, a code word only includes an indicator code. This will be described with use of an example. It is assumed that two code words are prepared for a data unit of 4 bits of consecutive zeros ("0b0000"). One of the code words is "0b0," and the other code word is "0b10000." Here, 0b indicates the binary representation. The former code word is 1 bit in length. The latter code word is 5 bits in length. The former 1-bit code word of "0" indicates that an indicator code is zero and that a digit value of a digit part is zero. The latter code word of "0b 10000" includes an indicator code of "1" and a 4-bit digit part of "0000."

It is assumed that a code word "0b1**" is assigned to 4-bit data "0b" other than consecutive zeros. This code word includes 5 bits, which includes an indicator code of "1" and a 4-bit digit part of "**".

When this code word is used for compression, data having 8 bits of consecutive zeros are compressed into 2-bit compressed data. Data having 16 bits of consecutive zeros are compressed into 4-bit compressed data. When such compressed data are expanded, the 2-bit compressed data become 8-bit expanded data in the former example. In the latter example, the 4-bit compressed data become 16-bit expanded data. For example, it is assumed that an expansion circuit can expand 5-bit compressed data for one cycle and that a receiver circuit can receive 16-bit expanded data for one cycle. If "0b00000" is inputted to the expansion circuit at that time, expanded data become 20 bits of consecutive zeros, which exceed the receiving speed (16 bits) of the receiver circuit. Thus, the receiver circuit cannot receive the expanded data. In such a case, if the last bit "0" is replaced with "0b10000," an input to the expansion circuit becomes "0b00001" and "0b0000*," which correspond to two cycles. The expansion circuit expands "0b00001" and outputs 16 bits of zeros. At that time, the last bit "1" is a symbol indicating that 4 bits to be inputted subsequently are outputted as they are. Thus, the last bit "1" is not outputted. The first 4 bits of "0b0000*" inputted in the next cycle are outputted as they are. As a result, the expanded data outputted from the expansion circuit become 20 bits of consecutive zeros.

Based upon the information on the expansion speed of the expansion circuit and the receiving speed of the receiver circuit, the determination unit 23 determines, with a unit of the code words, whether or not the speed of expanding the compressed data exceeds the receiving speed of the receiver circuit. Specifically, in the previous example, each digit of the compressed data "0b00000" indicates the code word used to compress data "0000." In accordance with the determination result of the determination unit 23, the replacement unit 24 replaces the last compression code word "0" with a code word having a lower compression ratio (longer code length). Thus, the compression ratio can be lowered with a unit of the code words so as not to exceed the receiving speed of the receiver circuit. Therefore, the compression ratio of the entire compressed data is hardly lowered.

In the above example, two types of code words including a code word having a high compression ratio (a short code length) and a code word having a low compression ratio (a long code length) are switched to use. Nevertheless, three or more code words having different compression ratios may be switched to use as long as compressed data can be expanded into the original data. When three or more code words having different compression ratios are used, adjusted and compressed data can be generated with a higher compression ratio while the expansion speed does not exceed the receiving speed.

The adjustment and compression tool 11 according to the present exemplary embodiment does not depend upon the compression method. This is because there is a code whose code length becomes longer than that of original data in any compression method.

Now a compressed data receiver device used in the compressed data transceiver apparatus according to the first embodiment of the present invention will be described with reference to FIG. 3.

Figure 3:
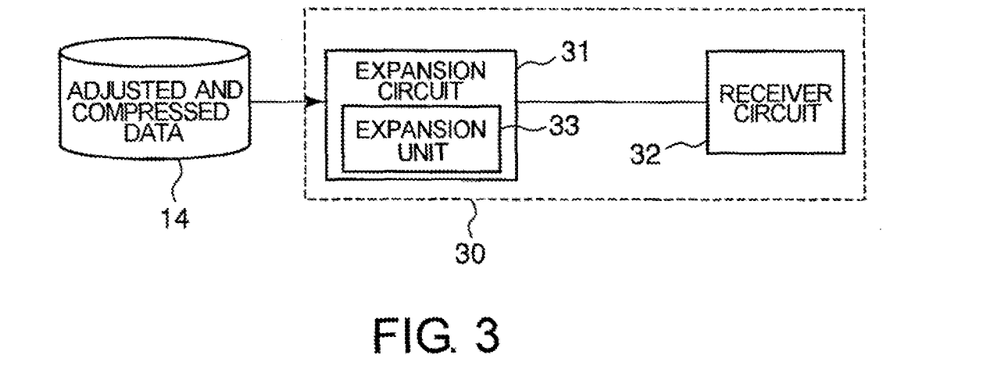
FIG. 3 is a block diagram showing a schematic configuration of a compressed data receiver device used in the compressed data transceiver apparatus according to the first embodiment of the present invention.

A compressed data receiver device 30 shown in FIG. 3 has an expansion circuit 31 and a receiver circuit 32. The expansion circuit 31 and the receiver circuit 32 are connected directly to each other without a buffer circuit.

The expansion circuit 31 has an expansion unit 33 as expansion means for receiving an input of the adjusted and compressed data 14 from the data compressor device shown in FIG. 1 and expanding the adjusted and compressed data 14. As described above, the adjusted and compressed data 14 are produced by compressing input data while switching a plurality of code words. The expansion unit 33 can perform an expansion process on such adjusted and compressed data 14. Specifically, in a case where a code word only includes an indicator code, the expansion unit 33 can recover data prior to the compression from the indicator code. In a case where a code word includes an indicator code and a digit part, the expansion unit 33 can find a compression rule of the digit part from the indicator code and recover data in which digits of the digit part are expanded, i.e., data prior to the compression, from the rule.

The data expanded in the expansion circuit 31 are supplied to the receiver circuit 32. As described above, the adjusted and compressed data 14 have been adjusted such that the expansion speed of the expansion circuit 31 (data rate of the expanded data) does not exceed the receiving speed of the receiver circuit 32. Therefore, the receiver circuit 32 can be connected directly to the expansion circuit 31. The receiver circuit 32 receives the expanded data from the expansion circuit 31 and performs a predetermined data process.

Figure 4:
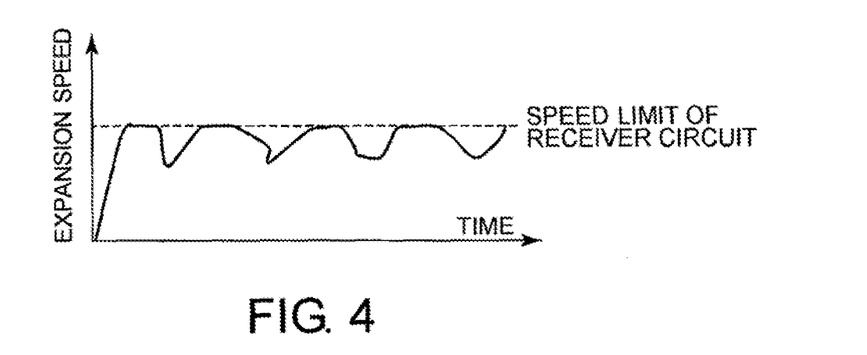
FIG. 4 is a graph showing a time-varying expansion speed of an expansion circuit included in the compressed data receiver device of FIG. 3.

FIG. 4 shows a time-varying expansion speed of the expansion circuit 31. As shown in FIG. 4, the expansion speed of the expansion circuit 31 never exceeds the receiving speed of the receiver circuit 32.

Next, a compressed data transceiver apparatus according to a second embodiment of the present invention will be described below with reference to FIGS. 5 to 10A and 10B.

The compressed data transceiver apparatus according to the present embodiment includes a reconfigurable device represented by an FPGA and a test device for the reconfigurable device. In this case, the data compressor device is used in a transmission circuit of the test device for testing the reconfigurable device. The reconfigurable device, which corresponds to an expansion circuit and a receiver circuit, constitutes a compressed data receiver device.

Furthermore, input data contain configuration information including a plurality of addresses and data corresponding to each of the addresses. Here, an address refers to information corresponding to an address at which corresponding data are to be stored. Data refer to a value that is to be stored at that address. Usually, an address is defined by continuing values. Meanwhile, data are values in accordance with a format specified by a device that uses the data (the reconfigurable device in this example).

Figure 5:
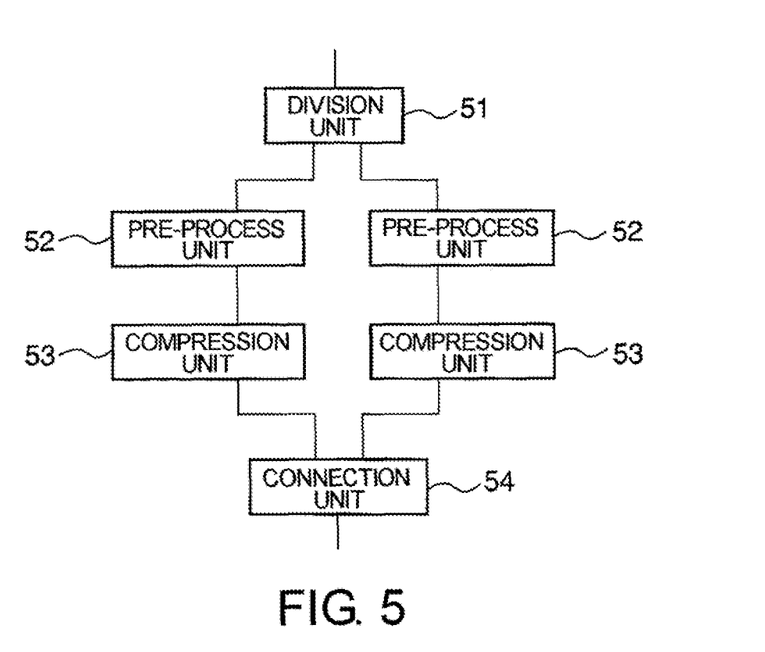
FIG. 5 is a block diagram showing a schematic configuration of a data compressor device used in a compressed data transceiver apparatus according to a second embodiment of the present invention.

FIG. 5 shows a schematic configuration of a data compressor device according to the present embodiment. The data compressor device has a division unit 51, pre-process units 52, compression units 53, and a connection unit 54. The compression unit 53 corresponds to the data compressor device of FIG. 1 (the adjustment and compression tool 11 and the information storage unit 12).

Figure 6:
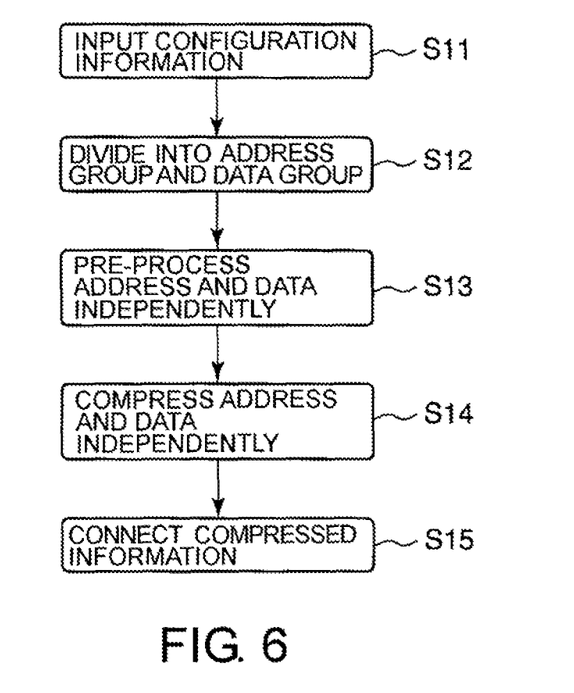
FIG. 6 is a flow chart explanatory of an operation of the data compressor device shown in FIG. 5.

FIG. 6 is a flow chart explanatory of an operation of the data compressor device shown in FIG. 5. The operation of the data compressor device shown in FIG. 5 will be described below with additional reference to FIG. 6.

First, when configuration information is inputted to the division unit 51 (Step S11), the division unit 51 divides the inputted configuration information into an address group and a data group (Step S12).

Then the two pre-process units 53 pre-process the divided address group and data group, respectively (Step S13). The pre-processing is to change the address group and the data group into data series suitable for compression so as to conform to the attribute (property) of the address group and the data group. The compression ratio of the compressed address group and data group can be improved by the pre-processing.

Subsequently, the two compression units 54 perform a compression process on the pre-processed address group and data group (Step S14). The compression process is a process of obtaining compressed data in which the compression ratio has been adjusted with a unit of the code words. The address group and the data group are compressed by the separate compression units 53. Therefore, a compression method suitable for address compression can be used for compressing the address group, and a compression method suitable for data compression can be used for compressing the data group. Accordingly, the compression ratios of the compressed address group and data group can further be improved.

Finally, the connection unit 54 connects the compressed data obtained for each of the address group and the data group and outputs the connected data as compressed configuration data (Step S15).

Now a configuration of a compressed data receiver device corresponding to the data compressor device shown in FIG. 5 will be described with reference to FIG. 7.

Figure 7:
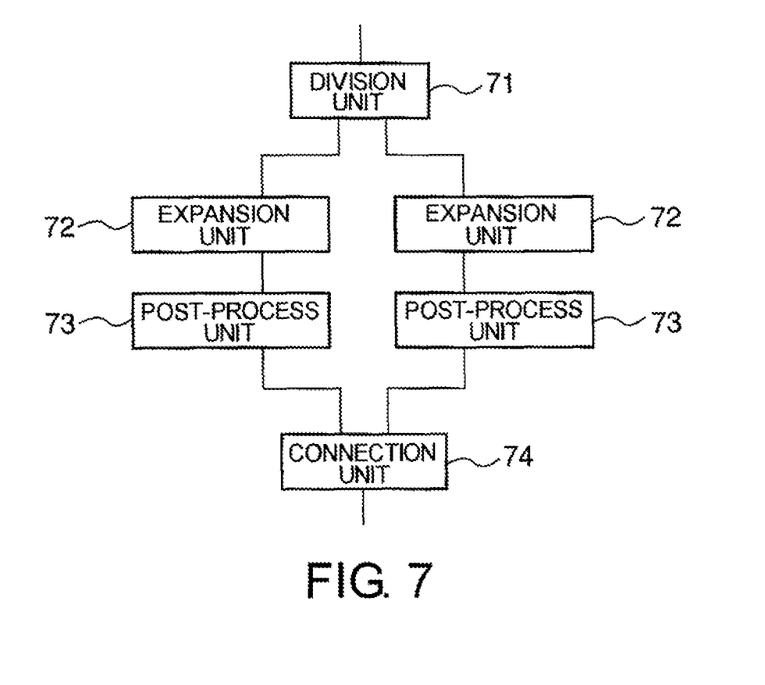
FIG. 7 is a block diagram showing a schematic configuration of a compressed data receiver device used in the compressed data transceiver apparatus according to the second embodiment of the present invention.

The compressed data receiver device of FIG. 7 has a division unit 71, expansion units 72, post-process units 73, and a connection unit 74.

Figure 8:
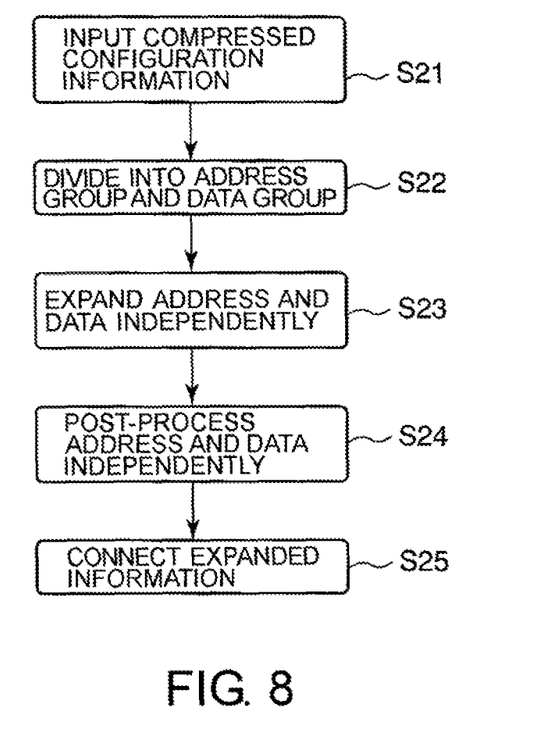
FIG. 8 is a flow chart explanatory of an operation of the compressed data receiver device shown in FIG. 7.

FIG. 8 is a flow chart explanatory of an operation of the compressed data receiver device shown in FIG. 7. The operation of the compressed data receiver device shown in FIG. 7 will be described below with additional reference to FIG. 8.

First, when the compressed configuration information is inputted into the division unit 71 from the data compressor device shown in FIG. 5 (Step S21), the compressed configuration information that has been inputted is divided into a compressed address group and a compressed data group (Step S22).

Then the two expansion units 72 expand the compressed address group and the compressed data group, respectively (Step S23). Those expansion units 72 respectively cope with the compression methods of the two compression units 53. Each of the expansion units 72 expands the compressed address group or the compressed data group in which the compression ratio has been adjusted with a unit of the code words, and outputs the expanded address group or the expanded data group. Since the compressed address group and the compressed data group, which have different attributes, are separately expanded, the expansion speed can remarkably be improved as compared to a case where those groups are expanded by a common expansion unit.

Subsequently, the two post-process units 73 post-process the expanded address group and the expanded data group (Step S24). The post-processing is a process equivalent to an inverse operation of the pre-processing (arithmetic processing) performed at the pre-process units 53.

Finally, the connection unit 74 connects the post-processed address group and data group to recover the configuration information (Step S25).

Operations of the data compressor device shown in FIG. 5 and the compressed data receiver device shown in FIG. 7 will further be described with reference to FIGS. 9, 10A, and 10B.

Figure 9:
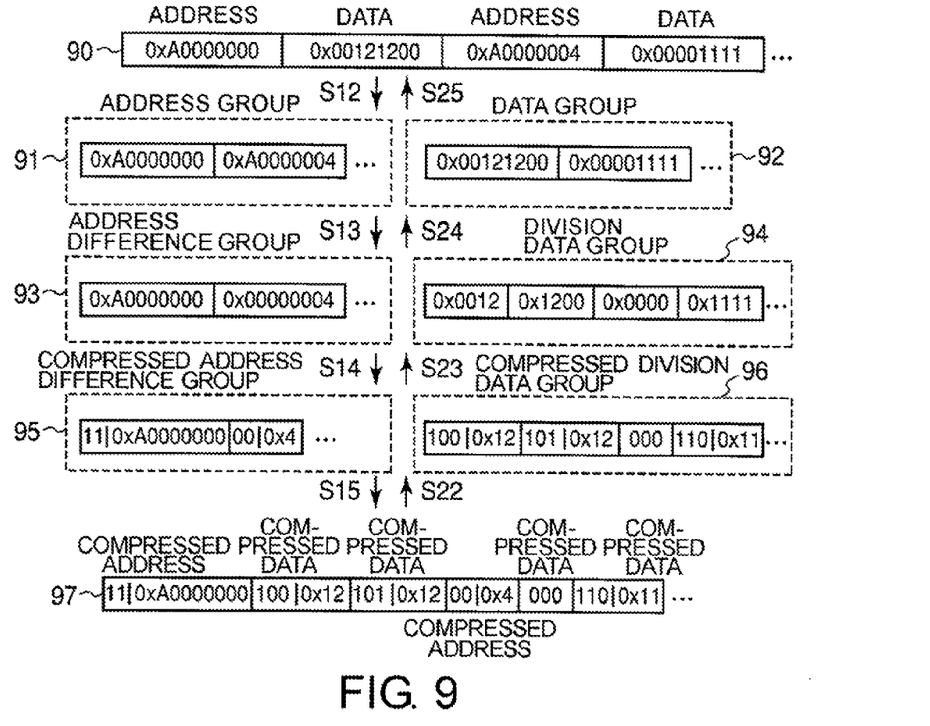
FIG. 9 is a diagram explanatory of changes of addresses and data in a compression process of the data compressor device shown in FIG. 5 and an expansion process of the compressed data receiver device shown in FIG. 7.

FIG. 9 is a diagram showing an example of changes of addresses and corresponding data in a compression process of compressing configuration information 90 to obtain compressed configuration information 97 and an expansion process of expanding the compressed configuration information 97 to recover the configuration information 90. Each combination of the letter S and numeral illustrated in FIG. 9 corresponds to the step numbers shown in FIG. 6 or 8.

As shown in FIG. 9, in the compression process, the configuration information 90 is divided into an address group 91 and a data group 92, which are pre-processed into an address difference group 93 and a division data group 94, respectively. The address difference group 93 and the division data group 94 are subjected to a compression process to produce a compressed address difference group 95 and a compressed division data group 96. The obtained compressed address difference group 95 and compressed division data group 96 are connected to each other so as to produce the compressed configuration information 97.

Meanwhile, in the expansion process, the compressed configuration information 97 is divided into a compressed address difference group 95 and a compressed division data group 96, which are expanded into an address difference group 93 and a division data group 94. The address difference group 93 and the division data group 94 are respectively post-processed to produce an address group 91 and a data group 92, which are connected to each other so as to recover the configuration information 90.

Specifically, the configuration information 90 includes a plurality of pairs of an address and corresponding data. In this example, a first pair of an address "0xA0000000" and data "0x00121200" and a second pair of an address "0xA0000004" and data "0x00001111" are illustrated. "0x" indicates that each digit is a hexadecimal number. Those addresses and data are illustrated by way of example. The values of the addresses and the data are not limited to this example. Furthermore, an address and data do not have a one-to-one relationship. A plurality of pieces of data may correspond to one address.

When the configuration information 90 is divided into an address group 91 and a data group 92, the address group 91 includes a head address "0xA0000000" and an address "0xA0000004" following the head address. Furthermore, the data group 92 includes head data "0x00121200" and data "0x00001111" following the head data.

Next, a process of calculating a difference between adjacent addresses is performed as pre-processing for the address group 91. The head address "0xA0000000" is left as it is. The following addresses are subjected to arithmetic processing of subtracting a preceding address therefrom. As a result, the address difference group 93 includes the head address "0xA0000000" and difference information "0x00000004" (a value obtained by subtracting 0xA0000000 from 0xA0000004), which follows the head address.

Generally, address information includes relatively consecutive values. However, since address information includes different values, it is difficult to compress the address information. Therefore, many pieces of information having the same address difference are extracted by the calculation of the differences as pre-processing. Thus, the compression ratio of the address information can remarkably be improved.

Meanwhile, each piece of data is divided into 16-bit data as pre-processing for the data group 92. When the data "0x00121200" and "0x00001111" are divided by 16 bits, a division data group 94 including "0x0012," "0x1200," "0x0000," and "0x1111" is produced.

Data used as configuration information of a reconfigurable device having a repeated configuration often have values with a small number of bits as the smallest unit. Therefore, many pieces of information having the same value can be extracted by 16-bit division as pre-processing. Thus, the compression ratio of the data information can remarkably be improved.

Figure 10A:
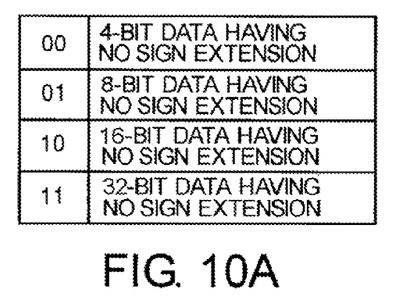
FIGS. 10A and 10B are a diagram showing an example of a compression rule used for compression of an address difference group and a diagram showing an example of a compression rule used for compression of a division data group.

The compression method of compressing the address difference group 93 follows a compression rule shown in FIG. 10A, which indicates the relationship between an indicator code and a meaning of the code. Thus, the address "0xA0000000" is converted into a code word "11|0xA0000000," which is a combination of an indicator code "0b11," which indicates 32-bit information, and the original address. (The symbol "|" is illustrated for convenience of making a distinction between the indicator code and the information following the indicator code. Thus, the symbol "|" itself is not information.) Furthermore, the difference information "0x00000004" is converted into a code word "00|0x4," which is a combination of an indicator code "0b00," which indicates 4-bit information, and "0x4." Thus, a compression process is performed on the difference information. Therefore, the compression ratio can remarkably be improved. If the expansion speed exceeds the receiving speed at the receiving side, one of the code series "0b01," "0b10," and "0b11" is selected depending upon the receiving speed. The difference information "0x00000004" is converted into 8-bit or 16-bit information, or is directly used as 32-bit information. Thus, the expansion speed is adjusted to be equal to or lower than the receiving speed. For example, when the difference information "0x00000004" is compressed into 4 bits, a code word is "00|0x4." The code length of the code word becomes 6 bits including the indicator code. When the difference information is compressed into 8-bit information, a code word is "10|0x04," which is a combination of an indicator code "0b10," which indicates 8 bits, and "0x04." Specifically, the difference information can be compressed into a code word having a length of 10 bits.

Figure 10B:
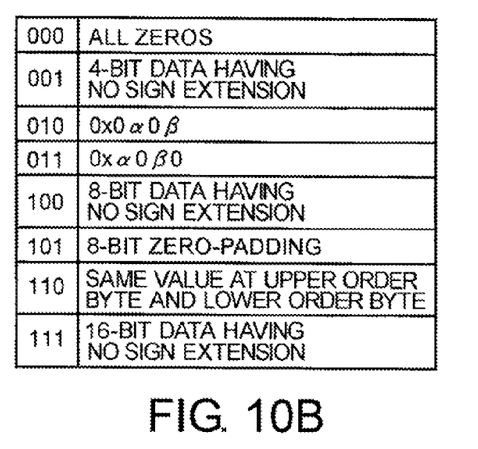

Meanwhile, a compression method of compressing the division data group 94 is different from the compression method used for compressing the division address group 93 and uses a compression rule shown in FIG. 10B, which indicates the relationship between an indicator code and a meaning of the code. Thus, the division data "0x0012" are converted into a code word "100|0x12," which is a combination of an indicator code "0b100" and "0x12." Furthermore, the division data "0x1200" are converted into a code word "101|0x12," which is a combination of an indicator code "0b101" and "0x12." Moreover, the division data "0x0000" is converted into a code word "0b000." Furthermore, the division data "0x1111" are converted into a code word "110|0x11," which is a combination of an indicator code "0b110" and "0x11."

A large number of compression rules are required to compress data having many bits at a high ratio. In contrast, data are divided into division data having a reduced number of bits, which are subjected to a compression process. Thus, the compression ratio can remarkably be improved with a small number of compression rules. In the compression process of the data group, if the expansion speed exceeds the receiving speed at the receiving side, the expansion speed can be adjusted to be equal to or lower than the receiving speed by generating a code word with use of one of the code series "0b001," "0b100," and "0b111" shown in FIG. 10B.

The compressed configuration information 97 is obtained by connecting the compressed address difference group 95 and the compressed division data group 96 produced in the aforementioned manner. In this example, two pieces of compressed data are sequentially arranged and connected to one compressed address so as to correspond to the sequence of the addresses and the data of the configuration information 90. Nevertheless, the connection sequence can be changed in any way.

The expansion process is an inverse process of the aforementioned compression process. Specifically, the compressed configuration information 97 is divided into a compressed address difference group 95 and a compressed division data group 96, which are expanded respectively. The obtained address difference group 93 is subjected to an addition process as post-processing, and the division data group 94 is subjected to a connection process as post-processing. Finally, the obtained address group 91 and data group 92 are connected to each other so as to recover the configuration information 90.

Now the compression rules shown in FIGS. 10A and 10B will be described.

The compression rule of FIG. 10A includes four rules. Specifically, a combination of an indicator code "0b00" and 4 bits is assigned as a code word to 4-bit data having no sign extension. A combination of a code series "0b01" and 8-bit data is assigned as a code word to 8-bit data having no sign extension. A combination of an indicator code "0b10" and 16-bit data is assigned as a code word to 16-bit data having no sign extension. A combination of an indicator code "0b11" and 32-bit data is assigned as a code word to 32-bit data having no sign extension.

Furthermore, the compression rule of FIG. 10B includes eight rules. In FIG. 10B, α and β represent any 4-bit data.

According to the compression rule of FIG. 10B, an indicator code "0b000" is assigned as a code word to data in which all are zero. A combination of an indicator code "0b001" and 4-bit data is assigned as a code word to 4-bit data having no sign extension. A combination of an indicator code "0b010" and 8-bit data is assigned as a code word to data "0x0α0β." A combination of an indicator code "0b011" and 8-bit data is assigned as a code word to data "0xα0β0." A combination of an indicator code "0b100" and 8-bit data is assigned as a code word to 8-bit data having no sign extension. A combination of an indicator code "0b100" and 8-bit data is assigned to 8-bit zero-padding data ("0xαβ00"). A combination of an indicator code "0b110" and 8-bit data is assigned as a code word to data having the same value at an upper order byte and a lower order byte ("0xαβαβ"). A combination of an indicator code "0b111" and 16-bit data is assigned as a code word to 16-bit data having no sign extension.

The compression rule shown in FIG. 10A is applied to the compression process of the address difference group 93, and the compression rule shown in FIG. 10B is applied to the compression process of the division data group 94. Thus, the compression ratio can remarkably be improved. In other words, the compression ratio can remarkably be improved by applying, to the compression processes of the address difference group 93 and the division data group 94, compression rules including a particular number of rules having a particular content suitable for the compression processes of the address difference group 93 and the division data group 94, respectively. Furthermore, with use of those code rules, the compression ratio can be adjusted with a unit of the code words such that the expansion speed does not exceed the receiving speed.

Next, a data compressor device and a compressed data receiver device used in a compressed data transceiver apparatus according to a third embodiment of the present invention will be described with reference to FIGS. 11 to 13.

The data compressor device according to the first embodiment controls the compression ratio with a unit of the code words such that the expansion speed of the expansion circuit does not exceed the receiving speed of the receiver circuit at the receiving side. With this technique, when a buffer circuit is provided between the expansion circuit and the receiver circuit, a control can be achieved so as to cause no overflow in the buffer circuit. The present embodiment allows a buffer circuit having a small storage capacity to be connected between the expansion circuit and the receiver circuit.

Figure 11:
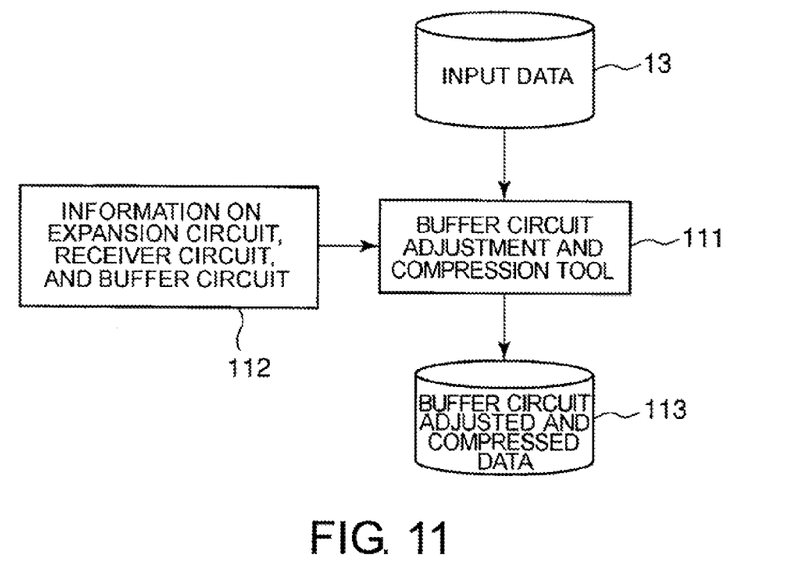
FIG. 11 is a block diagram showing a schematic configuration of a data compressor device used in a compressed data transceiver apparatus according to a third embodiment of the present invention.

FIG. 11 is a block diagram showing a schematic configuration of a data compressor device used in a compressed data transceiver apparatus according to the present embodiment. The illustrated data compressor device has a buffer circuit adjustment and compression tool 111 and an information storage unit 112. The information storage unit 112 stores therein information on a buffer circuit in addition to information on an expansion circuit at a receiving side and information on a receiver circuit. For example, the information on the expansion circuit, the receiver circuit, and the buffer circuit includes how many symbols are expanded for one cycle by the expansion circuit, how many bytes can be received for one cycle by the receiver circuit, and how many symbols can be stored in the buffer circuit.

The configuration of the buffer circuit adjustment and compression tool 111 is the same as the adjustment and compression tool 11 according to the first embodiment. However, determination in the determination unit is based upon whether or not an overflow is caused in a buffer circuit. Specifically, even if the expansion speed of the expansion circuit exceeds the receiving speed of the receiver circuit, a code word having a high compression ratio is outputted as it is without replacement with a code word having a low compression ratio as long as the buffer circuit can absorb the difference between those speeds. Thus, the buffer circuit adjustment and compression tool 111 emulates an operation of the expansion circuit and the buffer circuit, compresses input data 13 while it determines whether or not the receiver circuit can receive the input data 13, and outputs the compressed data as buffer circuit adjusted and compressed data 113. The buffer circuit adjusted and compressed data 113 have a compression ratio equal to or higher than that of the adjusted and compressed data 14 shown in FIG. 1.

Figure 12:
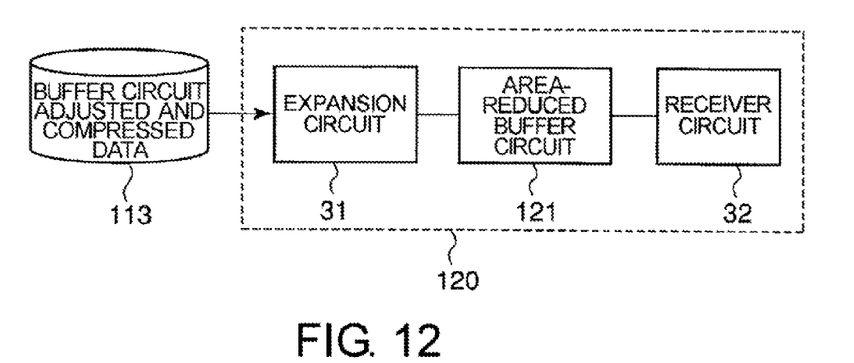
FIG. 12 is a block diagram showing a schematic configuration of a compressed data receiver device used in the compressed data transceiver apparatus according to the third embodiment of the present invention.
Figure 13:
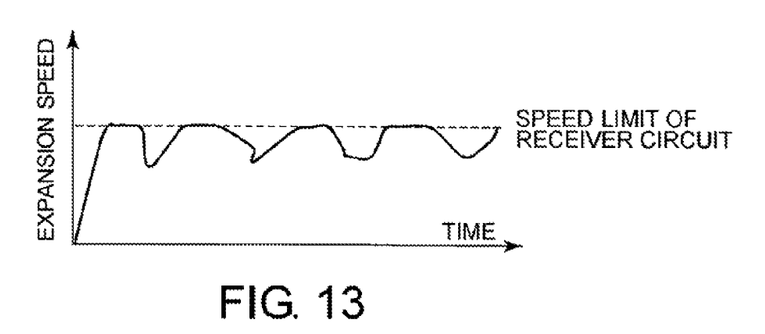
FIG. 13 is a graph showing a time-varying expansion speed of an expansion circuit included in the compressed data receiver device of FIG. 12.

FIG. 12 shows a schematic configuration of a compressed data receiver device 120 used in the compressed data transceiver apparatus according to the present embodiment. The illustrated compressed data receiver device 120 has an area-reduced buffer circuit 121 having a relatively small storage capacity, which is connected between the expansion circuit 31 and the receiver circuit 32, in addition to the configuration of the compressed data receiver device 30 shown in FIG. 3 (the expansion circuit 31 and the receiver circuit 32).

When the buffer circuit adjusted and compressed data 113 are inputted to the expansion circuit 31, the expansion circuit 31 expands the compressed data. At that time, the expansion speed may exceed the receiving speed of the receiver circuit 32 in some cases. However, the difference between those speeds is absorbed by the area-reduced buffer circuit 121. Since the compression ratio of the buffer circuit adjusted and compressed data 113 is adjusted with a unit of the code words so as to cause no overflow in the area-reduced buffer circuit 121, a situation in which the receiver circuit 32 cannot receive the compressed data does not occur.

FIG. 14 shows a time-varying expansion speed of the expansion circuit 31. As is difficult to understand from FIG. 14, the expansion speed may exceed the receiving speed.

According to the present embodiment, the manufacturing cost can be reduced as compared to the conventional technology by limiting the storage capacity (size) of the area-reduced buffer circuit 121. Furthermore, the compression ratio is not controlled uniformly so that the expansion speed of the expansion circuit 31 does not exceed the receiving speed of the receiver circuit 32. The compression ratio is controlled so as to cause no overflow in the area-reduced buffer circuit 121. Therefore, the flexibility of the code rules is enhanced. Thus, the compression ratio of the entire compressed data can be increased as compared to the first embodiment.

Although the present invention has been described along with some embodiments, the present invention is not limited to the aforementioned embodiments. As a matter of course, the present invention includes many variations and modifications that would be apparent to those skilled in the art within the present invention.

The whole or part of the exemplary embodiments disclosed above can be described as, but not limited to, the following supplementary notes.

(Supplementary Note 1)

A compressed data transceiver apparatus comprising:

a transmitter device operable to transmit compressed data; and a receiver device operable to recover and receive the compressed data, wherein the transmitter device comprises compression means for generating the compressed data while assigning one of a plurality of code words having different code lengths that are prepared for at least one data unit adaptably at a rate that does not exceed a predetermined receiving speed.

(Supplementary Note 2)

The compressed data transceiver apparatus as recited in Supplementary note 1, wherein the plurality of code words comprise a first code word for providing a first compression ratio and a second code word for providing a second compression ratio lower than the first compression ratio.

(Supplementary Note 3)

The compressed data transceiver apparatus as recited in Supplementary note 1 or 2, comprising:

an expansion circuit operable to expand the compressed data to generate expanded data; and a receiver circuit operable to receive the expanded data at the receiving speed, wherein the expansion circuit and the receiver circuit are connected to each other without any buffer circuit or with a buffer circuit having a small capacity.

(Supplementary Note 4)

The compressed data transceiver apparatus as recited in Supplementary note 3, wherein the compression means comprises first compression means and second compression means for respectively generating, as the compressed data, a compressed address information series and a compressed data information series in which an address information series and a data information series of address information and data information included in an address part and a corresponding data pail of configuration information for a reconfigurable device have been compressed.

(Supplementary Note 5)

The compressed data transceiver apparatus as recited in Supplementary note 4, comprising:

first and second pre-processing means for pre-processing the address information series and the data information series into series suitable for compression to generate a pre-processed address information series and a pre-processed data information series, wherein the pre-processed address information series and the pre-processed data information series are supplied to the first compression means and the second compression means.

(Supplementary Note 6)

The compressed data transceiver apparatus as recited in Supplementary note 5, wherein the first pre-processing unit generates the pre-processed address information series as a difference between adjacent pieces of address information that constitutes the address information series.

(Supplementary Note 7)

The compressed data transceiver apparatus as recited in Supplementary note 4, 5, or 6, wherein the expansion circuit comprises first and second expansion means for respectively expanding the compressed address information series and the compressed data information series as the compressed data to generate an expanded address information series and an expanded data information series.

(Supplementary Note 8)

The compressed data transceiver apparatus as recited in Supplementary note 7, comprising:

first post-processing means for performing, on the expanded address information series, a process inverse to the first processing means for generating the pre-processed address information series from the address information series to generate a post-processed address information series; and second post-processing means for performing, on the expanded data information series, a process inverse to the second processing means for generating the pre-processed data information series from the data information series to generate a post-processed data information series.

(Supplementary Note 9)

The compressed data transceiver apparatus as recited in Supplementary note 8, wherein the first post-processing unit performs an addition operation of adjacent pieces of address information that constitutes the expanded address information series to generate the post-processed address information series.

(Supplementary Note 10)

The compressed data transceiver apparatus as recited in Supplementary note 7, 8, or 9, wherein the first and second expansion means perform an expansion in accordance with a compression rule specific to each of the first and second expansion means.

(Supplementary Note 11)

A data compression method of compressing input data to generate compressed data, comprising:

generating the compressed data while adaptably assigning one of a plurality of code words having different code lengths that are prepared for at least one data unit, thereby adjusting a compression ratio of the compressed data with a unit of the code words.

(Supplementary Note 12)

The data compression method as recited in Supplementary note 11, wherein one of the assignments of the plurality of code words comprises such an assignment that the compressed data have a code length as short as possible and that a data rate at the time of expansion of the compressed data does not exceed a predetermined value.

(Supplementary Note 13)

The data compression method as recited in Supplementary note 12, wherein the generating the compressed data comprises:

sequentially compressing input data with a code word that minimizes the code length among the plurality of code words to generate auxiliary compressed data, determining whether or not a data rate at the time of expansion of the auxiliary compressed data exceeds the predetermined value, and replacing the corresponding code word included in the auxiliary compressed data with a code word having a longer code length when the data rate at the time of expansion of the auxiliary compressed data has been determined to exceed the predetermined value.

(Supplementary Note 14)

The data compression method as recited in Supplementary note 11, 12, or 13, wherein the predetermined value is a receiving speed of a receiver circuit operable to receive expanded data into which the compressed data are expanded.

(Supplementary Note 15)

A data compressor device comprising:

compression means for generating compressed data while assigning one of a plurality of code words having different code lengths that are prepared for at least one data unit adaptably at a rate that does not exceed a predetermined receiving speed of a receiver device.

(Supplementary Note 16)

The data compressor device as recited in Supplementary note 15, wherein one of the assignments of the plurality of code words comprises such an assignment that the compressed data have a code length as short as possible and that a data rate at the time of expansion of the compressed data does not exceed a predetermined value.

(Supplementary Note 17)

The data compressor device as recited in Supplementary note 15 or 16, comprising code storage means for storing the plurality of code words having different code lengths that are prepared for at least one data unit (Supplementary Note 18)

The data compressor device as recited in Supplementary note 15, 16, or 17, wherein the data compression means comprises:

auxiliary data compression means for sequentially compressing input data with a code word that minimizes the code length among the plurality of code words, determination means for determining whether or not a data rate at the time of expansion of the auxiliary compressed data exceeds the predetermined value, and replacement means for replacing the corresponding code word included in the auxiliary compressed data with a code word having a longer code length when the data rate at the time of expansion of the auxiliary compressed data has been determined to exceed the predetermined value.

(Supplementary Note 19)

The data compressor device as recited in Supplementary note 17 or 18, further comprising:

information storage means for storing the predetermined value.

(Supplementary Note 20)

A compressed data receiver device comprising:

an expansion circuit operable to expand compressed data and a receiver circuit operable to receive expanded data that have been expanded by the expansion circuit, wherein the expansion circuit comprises expansion means for expanding compressed data generated by adaptably assigning one of a plurality of code words having different code lengths that are prepared for at least one data unit, wherein the expansion circuit and the receiver circuit are connected to each other without any buffer circuit or with a buffer circuit having a small capacity.

This application claims the benefit of priority from Japanese patent application No. 2009-154931, filed on Jun. 30, 2009, the disclosure of which is incorporated herein in its entirety by reference.

The invention claimed is:

1. A data compression method of compressing input data to generate compressed data, comprising:

generating the compressed data while adaptably assigning one of a plurality of code words having different code lengths that are prepared for at least one data unit, thereby adjusting a compression ratio of the compressed data with a unit of the code words, wherein one of the assignments of the plurality of code words comprises such an assignment that the compressed data have a code length as short as possible and that a data rate at the time of expansion of the compressed data does not exceed a predetermined value, wherein the generation the compressed data comprises:

sequentially compressing input data with a code word that minimizes the code length among the plurality of code words to generate auxiliary compressed data, determining whether or not a data rate at the time of expansion of the auxiliary compressed data exceeds the predetermined value, and replacing the corresponding code word included in the auxiliary compressed data with a code word having a longer code length when the data rate at the time of expansion of the auxiliary compressed data has been determined to exceed the predetermined value.

2. The data compression method as recited in claim 1, wherein the predetermined value is a receiving speed of a receiver circuit operable to receive expanded data into which the compressed data are expanded.

3. A data compressor device comprising:

data compression means for generating compressed data while assigning one of a plurality of code words having different code lengths that are prepared for at least one data unit adaptably at a rate that does not exceed a predetermined receiving speed of a receiver device, wherein one of the assignments of the plurality of code words comprises such an assignment that the compressed data have a code length as short as possible and that a data rate at the time of expansion of the compressed data does not exceed a predetermined value, wherein the data compression means comprises:

auxiliary data compression means for sequentially compressing input data with a code word that minimizes the code length among the plurality of code words, determination means for determining whether or not a data rate at the time of expansion of the auxiliary compressed data exceeds the predetermined value, and replacement means for replacing the corresponding code word included in the auxiliary compressed data with a code word having a longer code length when the data rate at the time of expansion of the auxiliary compressed data has been determined to exceed the predetermined value.

4. The data compressor device as recited in claim 3, comprising code storage means for storing the plurality of code words having different code lengths that are prepared for at least one data unit.

5. The data compressor device as recited claim 3, further comprising:

information storage means for storing the predetermined value.

* * * * *